(12) United States Patent
Kondo

(10) Patent No.: US 8,722,507 B2
(45) Date of Patent: May 13, 2014

(54) METHOD FOR FORMING IDENTIFICATION MARKS ON SILICON CARBIDE SINGLE CRYSTAL SUBSTRATE, AND SILICON CARBIDE SINGLE CRYSTAL SUBSTRATE

(75) Inventor: Sadahiko Kondo, Mishima-gun (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 13/817,907

(22) PCT Filed: Jan. 5, 2012

(86) PCT No.: PCT/JP2012/050080
§ 371 (c)(1),
(2), (4) Date: Feb. 20, 2013

(87) PCT Pub. No.: WO2012/093684
PCT Pub. Date: Jul. 12, 2012

(65) Prior Publication Data
US 2013/0157009 A1 Jun. 20, 2013

(30) Foreign Application Priority Data
Jan. 6, 2011 (JP) .................................. 2011-001235

(51) Int. Cl.
*H01L 21/76* (2006.01)
(52) U.S. Cl.
USPC .................................... 438/401; 438/700
(58) Field of Classification Search
USPC .................. 438/401, 690, 700, 975; 257/797
See application file for complete search history.

(56) References Cited

U.S. PATENT DOCUMENTS

| | | | |
|---|---|---|---|
| 5,483,038 A | 1/1996 | Ota et al. | |
| 6,218,199 B1 | 4/2001 | Sato | |
| 7,763,543 B2 * | 7/2010 | Nagaya et al. | 438/700 |
| 2005/0282396 A1 * | 12/2005 | Lin et al. | 438/745 |
| 2006/0057850 A1 * | 3/2006 | Britt et al. | 438/690 |

FOREIGN PATENT DOCUMENTS

| | | |
|---|---|---|
| JP | 08-031776 A | 2/1996 |
| JP | 09-223648 A | 8/1997 |
| JP | 10-230377 A | 9/1998 |
| JP | 2000-288752 A | 10/2000 |

(Continued)

OTHER PUBLICATIONS

Zhang, Direct photoetchint of single crystal SiC by vUV-266 nm multiwavelength laser ablation, Apr. 1997, EBSCO, p. 1.*

(Continued)

*Primary Examiner* — Kevin M Picardat
(74) *Attorney, Agent, or Firm* — Keating & Bennett, LLP

(57) ABSTRACT

A method for forming an identification mark on a silicon carbide single crystal substrate according to the present invention includes: (a) scanning a principal surface of a silicon carbide single crystal substrate with a laser beam at a first energy density such that a groove is formed in the principal surface of the silicon carbide single crystal substrate, thereby forming an identification mark which is constituted of one or more grooves in the principal surface of the silicon carbide single crystal substrate; and (b) scanning an inside of the groove formed in the principal surface of the silicon carbide single crystal substrate with a laser beam at a second energy density that is lower than the first energy density.

6 Claims, 7 Drawing Sheets

(56) References Cited

FOREIGN PATENT DOCUMENTS

| | | |
|---|---|---|
| JP | 2000-312983 A | 11/2000 |
| JP | 2001-230165 A | 8/2001 |
| JP | 2004-066299 A | 3/2004 |
| JP | 2006-043717 A | 2/2006 |
| JP | 2008-181972 A | 8/2008 |
| JP | 2009-295767 A | 12/2009 |
| JP | 2010-207845 A | 9/2010 |

OTHER PUBLICATIONS

English translation of Official Communication issued in corresponding International Application PCT/JP2012/050080, mailed on Jul. 18, 2013.

Official Communication issued in International Patent Application No. PCT/JP2012/050080, mailed on Apr. 17, 2012.

Official Communication issued in corresponding Japanese Patent Application No. 2012-551869, mailed on Dec. 3, 2013.

* cited by examiner

FIG.3
(a)
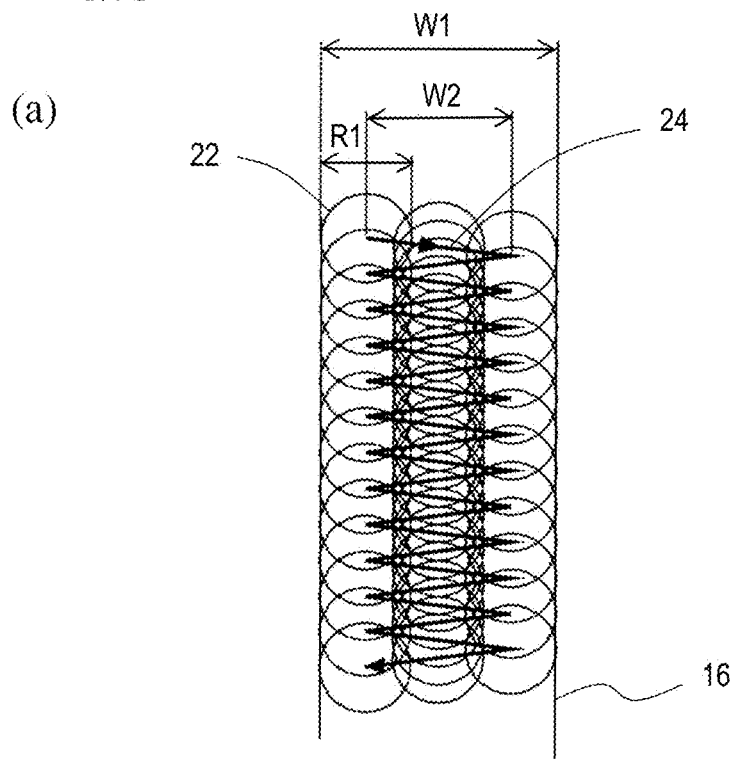
(b)
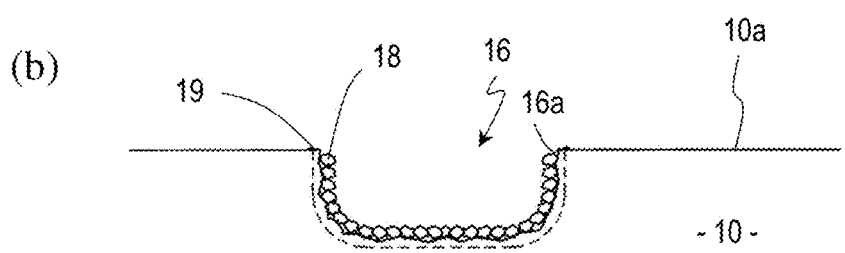

FIG.4
(a)
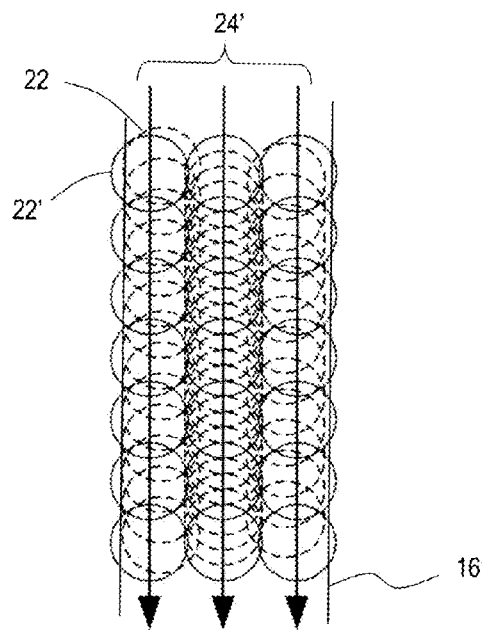
(b)
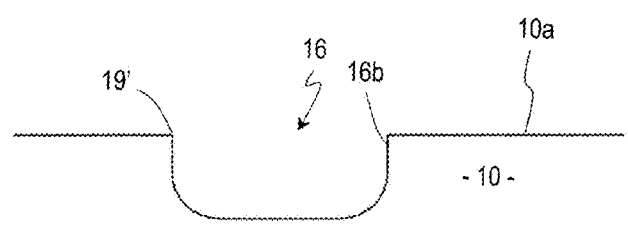
FIG.5
(a)
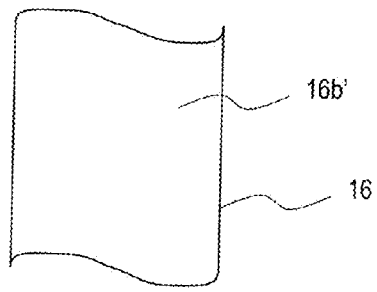
(b)
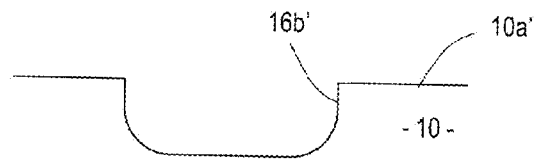

FIG. 9
(a)
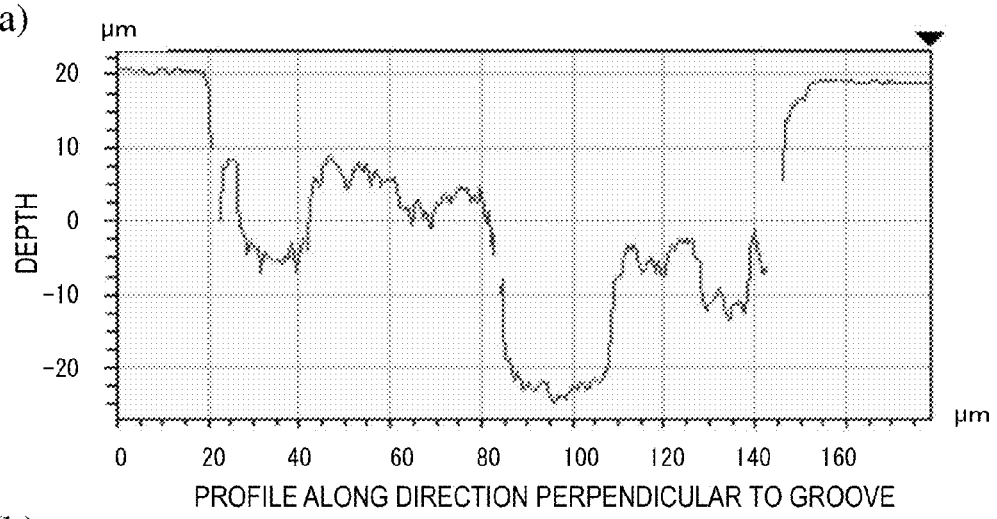
PROFILE ALONG DIRECTION PERPENDICULAR TO GROOVE
(b)
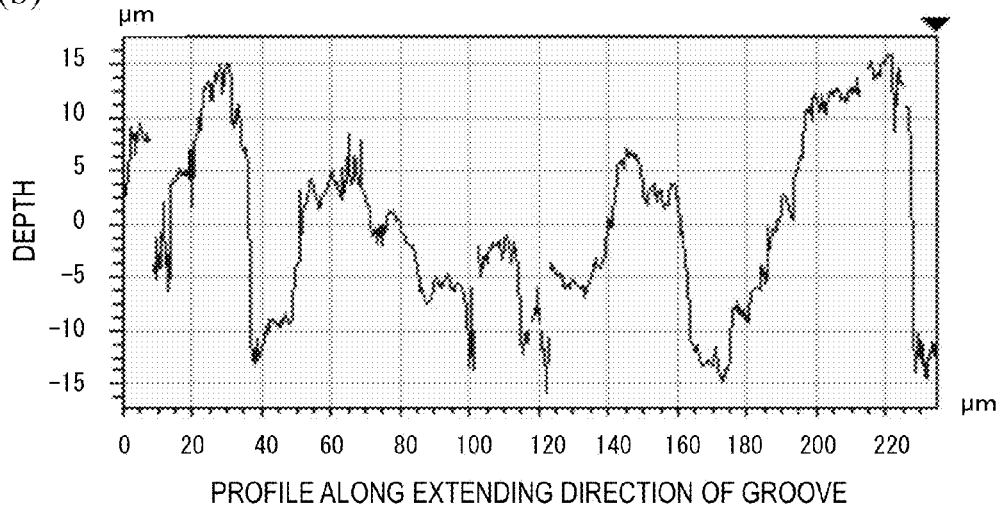
PROFILE ALONG EXTENDING DIRECTION OF GROOVE

METHOD FOR FORMING IDENTIFICATION MARKS ON SILICON CARBIDE SINGLE CRYSTAL SUBSTRATE, AND SILICON CARBIDE SINGLE CRYSTAL SUBSTRATE

TECHNICAL FIELD

The present invention relates to a method for forming an identification mark on a silicon carbide single crystal substrate and particularly to a method for forming an identification mark on a silicon carbide single crystal substrate using a laser beam.

BACKGROUND ART

The silicon carbide semiconductor has a larger dielectric breakdown electric field, a faster saturated drift velocity of electrons, and a greater thermal conductivity than those of the silicon semiconductor. Thus, research and development have been intensively carried out for realizing a power device which is capable of a large current operation at a high temperature and at a high speed with the use of a silicon carbide semiconductor as compared with conventional silicon devices. Among others, motors for use in electric motorcycles, electric vehicles, and hybrid vehicles are AC-driven or inverter-controlled, and therefore, development of efficient switching devices for such uses has been receiving attention. To realize such power devices, a silicon carbide single crystal substrate for epitaxial growth of a high-quality silicon carbide semiconductor layer is necessary.

Demands for blue laser diodes which are used as a light source for recording data at a high density and white diodes which are used as a light source in place of a fluorescent lamp or an incandescent bulb have been growing. Such light-emitting devices are manufactured using a gallium nitride semiconductor, and in some cases, a silicon carbide single crystal substrate is used as the substrate for formation of a high-quality gallium nitride semiconductor layer. Therefore, there is demand for a silicon carbide single crystal substrate which is used as a substrate for manufacture of a semiconductor device for which demand is expected to undergo a large growth in the future, such as a silicon carbide semiconductor device, a gallium nitride semiconductor device, etc.

To a semiconductor substrate which is used for manufacture of a semiconductor device, information for identification is provided as an identification mark for identifying semiconductor substrates and managing the process conditions of the manufacture process through which they have undergone for each of the semiconductor substrates. Usually, the identification mark has a size which is perceivable by a human eye. However, in other cases, the identification mark is imaged by a camera or the like and image-processed so as to be detected by a semiconductor manufacturing apparatus or the like.

In forming an identification mark on a semiconductor substrate, a laser beam is usually used. The semiconductor in a region irradiated with a laser beam is melted and evaporated, whereby a recessed portion is formed in the surface of the semiconductor substrate. The recessed portion constitutes an identification mark. According to the depth of this recessed portion, the method for forming an identification mark is generally divided into two types. Specifically, formation of an identification mark with a recessed portion depth of about 0.1 μm to 5 μm is referred to as "soft marking", and formation of an identification mark with a recessed portion depth of about 5 μm to 100 μm is referred to as "hard marking". Also, in some cases, the identification mark is constituted of a recessed portion which is in the form of an independent dot, and in other cases, the identification mark is constituted of one or more linear grooves.

Silicon carbide is a new semiconductor material and has a higher melting point and a greater hardness than other semiconductor materials which are widely employed, such as silicon, gallium arsenide, etc. Therefore, it is generally difficult to form a desirable identification mark on a silicon carbide single crystal substrate under the conditions that are suitable for formation of an identification mark on a silicon substrate. Patent Document 1 discloses the technique of forming an identification mark which has an excellent visibility, which is realized by irradiating a silicon carbide single crystal substrate with pulsed laser light which has a predetermined pulse shape such that the silicon carbide is melted, whereby a slightly-recessed region is formed which contains a greater amount of carbon or silicon.

CITATION LIST

Patent Literature

Patent Document 1: Japanese Laid-Open Patent Publication No. 2006-43717

SUMMARY OF INVENTION

Technical Problem

According to the method of Patent Document 1, an identification mark which is constituted of a slightly-recessed dot is formed. Therefore, it is inferred that, according to the method of Patent Document 1, the identification mark which is constituted of the dot is formed by soft marking. Formation of the identification mark by soft marking is usually performed on a mirror-finished semiconductor substrate in many cases. However, since formation of the identification mark leads to formation of a bump in the substrate, there is a problem that the flatness of the substrate is marred.

Patent Document 1 discloses that a recessed portion in the form of a dot which constitutes an identification mark is formed by a region which contains a greater amount of carbon or silicon, whereby the perceivability which is attributed to reflected light and transmitted light is improved. However, there is a problem that an identification mark which is constituted of a dot is intrinsically inferior in visibility to an identification mark which is constituted of a line. Further, the recessed portion in the form of a dot which constitutes the identification mark has a small size, and therefore, laser dust, such as a solidified substance of silicon carbide melted by laser irradiation, abrasive grains, or other minute contaminants which can be produced in the middle of the semiconductor manufacturing process readily remain in the recessed portion in the form of a dot. Such contaminants remaining in the recessed portion can be a cause for contamination of the surface of the substrate when they are separated from the recessed portion, or a cause for formation of scars in the surface, in a substrate manufacturing process or a semiconductor device manufacturing process which would be performed later.

The present invention solves at least one of the above problems which arise in the prior art. One of the objects of the present invention is to provide a method for forming a highly-visible identification mark on a silicon carbide single crystal substrate.

Solution to Problem

A method for forming an identification mark on a silicon carbide single crystal substrate according to the present invention includes: (a) scanning a principal surface of a silicon carbide single crystal substrate with a laser beam at a first energy density such that a groove is formed in the principal surface of the silicon carbide single crystal substrate, thereby forming an identification mark which is constituted of one or more grooves in the principal surface of the silicon carbide single crystal substrate; and (b) scanning an inside of the groove formed in the principal surface of the silicon carbide single crystal substrate with a laser beam at a second energy density that is lower than the first energy density.

In a preferred embodiment, a width of the groove is not less than 50 μm, and a depth of the groove is not less than 20 μm.

In a preferred embodiment, at least at a bottom surface of an internal surface of the groove, the surface roughness Ra is not more than 1 μm.

In a preferred embodiment, the method further includes (c) after step (b), performing mechanical polishing on the principal surface of the silicon carbide single crystal substrate.

In a preferred embodiment, after step (c), gas phase etching is performed on the principal surface of the silicon carbide single crystal substrate.

In a preferred embodiment, the surface roughness Ra of the principal surface of the silicon carbide single crystal substrate is not less than 0.1 nm and not more than 2.0 nm.

A silicon carbide single crystal substrate of the present invention has an identification mark on a principal surface of the silicon carbide single crystal substrate, the identification mark being constituted of one or more grooves, wherein a width of the groove is not less than 50 μm and less than 0.5 mm, and a depth of the groove is not less than 20 μm, and a surface roughness Ra of an internal surface of the groove is not more than 1 μm.

In a preferred embodiment, a bottom surface of the groove is a solidified surface.

In a preferred embodiment, the bottom surface of the groove has a striped pattern.

Advantageous Effects of Invention

According to the present invention, a silicon carbide single crystal substrate can be obtained that has an identification mark on which there is substantially no contaminant in a groove and which has excellent identifiability.

BRIEF DESCRIPTION OF DRAWINGS

FIG. 3(a) shows a scanning pattern of a laser beam in a rough laser step. FIG. 3(b) schematically shows a cross section of a groove formed in a principal surface of a silicon carbide single crystal substrate in the rough laser step.

FIG. 4(a) shows a scanning pattern of a laser beam in a finishing laser step. FIG. 4(b) schematically shows a cross section of a groove formed in a principal surface of a silicon carbide single crystal substrate in the finishing laser step.

FIGS. 5(a) and 5(b) are a schematic plan view and a schematic cross-sectional view of a groove formed in a mechanically-polished principal surface of a silicon carbide single crystal substrate.

FIGS. 9(a) and 9(b) are a surface profile along the cross-sectional direction and a surface profile along the longitudinal direction of a groove which constitutes an identification mark which is formed by the method of Comparative Example.

DESCRIPTION OF EMBODIMENTS

Figure 1:
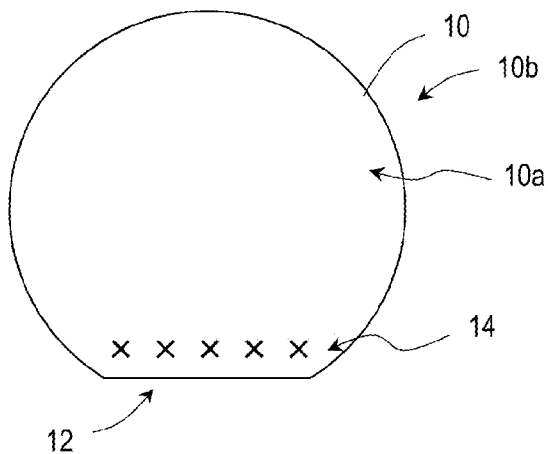
FIG. 1 is a schematic diagram showing a silicon carbide single crystal substrate in which an identification mark has been formed by a method of the present invention.

Hereinafter, an embodiment of a method for forming an identification mark on a silicon carbide single crystal substrate is described with reference to the drawings. FIG. schematically shows a silicon carbide single crystal substrate 10 in which an identification mark 14 is formed by a method for forming an identification mark on a silicon carbide single crystal substrate according to the present embodiment. The silicon carbide single crystal substrate 10 is made of silicon carbide monocrystal. The polytype of the silicon carbide monocrystal is not particularly limited. It may be any polytype of silicon carbide monocrystal. The size and thickness of the silicon carbide single crystal substrate 10 are not particularly limited.

The silicon carbide single crystal substrate 10 has a pair of principal surfaces 10a and 10b. The identification mark 14 is formed in one principal surface 10a. The plane orientation of the principal surfaces 10a and 10b is not particularly limited. The crystal axis of the silicon carbide monocrystal and the normal lines of the principal surfaces 10a and 10b may be identical with each other (so-called "just substrate"). Alternatively, the normal lines of the principal surfaces 10a and 10b may form an angle which is greater than 0° with respect to the crystal axis of the silicon carbide monocrystal (so-called "off substrate"). The principal surface 10a that has the identification mark 14 is the rear surface, while the principal surface 10b is the front surface on which a semiconductor device is to be formed.

The principal surface 10b of the silicon carbide single crystal substrate 10 is preferably a mirror surface. Specifically, the surface roughness of the principal surface 10b, Ra, is preferably not more than 2.0 nm. This is because a high-quality silicon carbide layer or gallium nitride layer is epitaxially grown on the principal surface 10b for fabrication of a semiconductor device. The lower limit of the surface roughness Ra of the principal surface 10b is not particularly limited. However, as the surface roughness Ra decreases, the processing of the principal surface 10b requires a longer time, so that the productivity of the silicon carbide single crystal substrate 10 deteriorates. Thus, from the viewpoint of industrial mass productivity, the surface roughness Ra of the principal surface 10b is preferably not less than 0.1 nm.

On the other hand, the principal surface 10a has a surface roughness which is selected according to its use or specifications required of the silicon carbide single crystal substrate 10. Specifically, the principal surface 10a may be a mirror surface or may be a surface finished by mechanical polishing. When the principal surface 10a is a mirror surface, the surface roughness Ra of the principal surface 10a is not more than 2.0 nm. When the principal surface 10a is a surface finished by mechanical polishing, the surface roughness Ra of the principal surface 10a is not less than 50 nm and not more than 1000 nm.

In the present embodiment, the identification mark 14 is formed in the vicinity of an orientation flat 12 of the silicon carbide single crystal substrate 10. However, the position of the identification mark 14 is not particularly limited. The identification mark 14 may be formed at any other position over the principal surface 10a.

The identification mark 14 may be constituted of characters which are used in various languages, such as numerals, alphabets, Katakana characters, Hiragana characters, Kanji characters, etc., and symbols. The number of characters is not particularly limited. The identification mark 14 preferably has a size which is perceivable by a naked eye. For example, it is preferred that the size of a single character is 0.8 mm or 1.6 mm. The upper limit of the size of a single character of the identification mark 14 is not particularly limited. However, when the size of a single character is excessively large, formation of characters takes a long time. The groove width is preferably not more than 0.5 mm.

As will be described in detail hereinbelow, the aforementioned alphanumeric characters which constitute the identification mark 14 are not an identification mark which is constituted of recessed portions in the form of dots but an identification mark which is constituted of linear grooves. To secure sufficient visibility for a naked eye, the depth of the groove is preferably not less than 20 μm, and the width of the groove is preferably not less than 50 μm.

Figure 2:
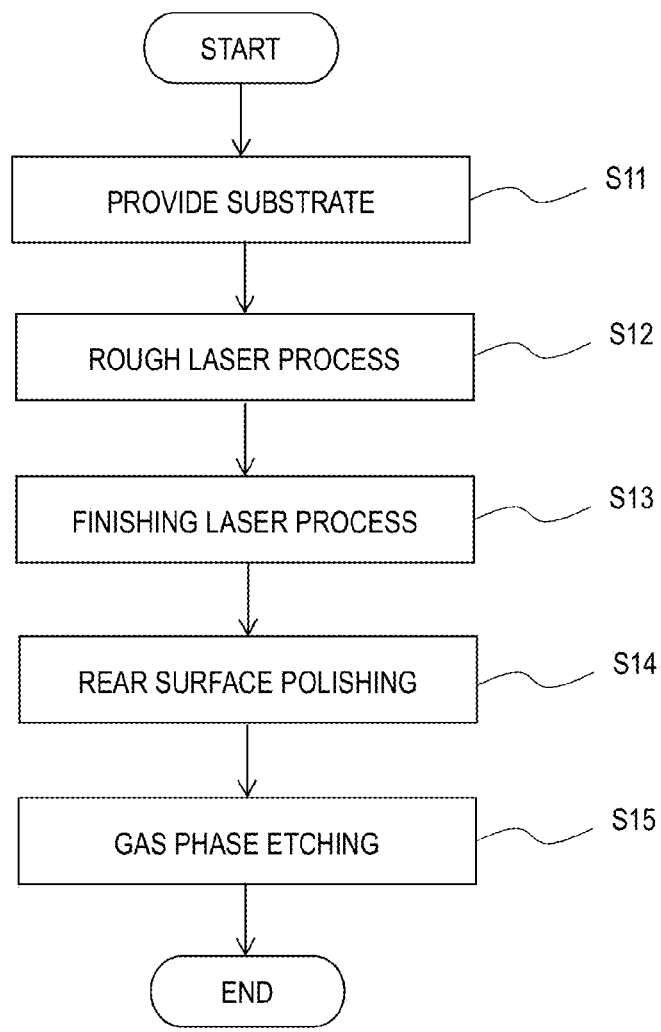
FIG. 2 is a flowchart illustrating an embodiment of a method for forming an identification mark on a silicon carbide single crystal substrate according to the present invention.

Hereinafter, a method for forming an identification mark on a silicon carbide single crystal substrate according to the present embodiment is described in detail with reference to FIG. 1 and the flowchart shown in FIG. 2.

First, a silicon carbide single crystal substrate 10 is provided (step S11). As described above, the size, thickness, and polytype of the silicon carbide single crystal substrate 10 and the directions of the normal lines of the principal surface 10a and the principal surface 10b are not particularly limited. The principal surface 10b of the silicon carbide single crystal substrate 10 before formation of the identification mark 14 may have a surface roughness which is obtained after being finished by mechanical polishing or may be a mirror surface.

On the other hand, the principal surface 10a preferably has a surface roughness which is obtained after being finished by mechanical polishing. This is because, when the surface roughness of the principal surface 10a is generally equal to a surface roughness which is obtained after being finished by mechanical polishing, the laser beam for formation of the identification mark 14 is prevented from passing through the silicon carbide single crystal substrate 10 as compared with the case where the principal surface 10a is a mirror surface, so that energy can be efficiently supplied to the principal surface 10a of the silicon carbide single crystal substrate 10, and the groove of the identification mark 14 can be formed. Further, the principal surface 10a of the silicon carbide single crystal substrate 10 may be directly irradiated with a laser beam such that the energy of the laser beam can be supplied to the principal surface 10a, without providing an energy absorbing layer on the principal surface 10a of the silicon carbide single crystal substrate 10 for absorbing the energy of the laser beam. Further, when the principal surface 10a has a mirror surface before formation of the identification mark 14, the principal surface 10a that is a mirror surface is mechanically polished after formation of the identification mark 14 as will be described later, and therefore, the previous mirror finishing step is of no use. In view of such circumstances, specifically, the surface roughness Ra of the principal surface 10a is preferably not less than 50 nm and not more than 1000 nm. To sufficiently obtain the above-described effects, more preferably, the surface roughness Ra of the principal surface 10a is not less than 100 nm and not more than 500 nm.

Then, the principal surface 10a of the provided silicon carbide single crystal substrate 10 is scanned with a laser beam such that the identification mark 14 is formed in the principal surface 10a. Formation of the identification mark is realized by forming the identification mark 14 which is constituted of one or more grooves by the rough laser process (step S12) and finishing the inside of the grooves by the finishing laser process (step S13). First, the rough laser process (step S12) is described.

As the laser light source which emits a laser beam for formation of the identification mark 14, a various types of laser light sources for use in laser marking may be used. Here, the laser light source may include not only a light-emitting light source which emits laser light but also an optical system which is used for adapting the beam diameter, a Q switch which is used for pulse driving of a laser beam, and a wavelength converter element which is used for adapting the wavelength of a laser beam. The laser light source which is used in the present embodiment is configured to emit a laser beam at a wavelength which is suitable to melting and evaporation of the silicon carbide monocrystal. Specifically, the laser light source preferably emits a laser beam at a wavelength of not less than 532 nm and not more than 1064 nm. A laser light source which is configured to emit a laser beam at a wavelength shorter than 532 nm includes an expensive oscillator and is a large-size device. Therefore, particularly, the cost of forming an identification mark is likely to increase.

The beam diameter of the laser beam emitted from the laser light source depends on the size of the identification mark 14 which is to be formed and the power of the laser light source. For example, the laser light source emits a laser beam which has a beam diameter of, for example, not less than 5 μm and not more than 50 μm. The power of the laser light source is, for example, not less than 1.0 W and not more than 2.0 W. Using a laser light source whose power exceeds the upper limit is not preferred because there is a probability that damage, such as a slip, is caused in crystal.

The principal surface 10a of the silicon carbide single crystal substrate 10 is scanned with a laser beam using a laser light source such that the identification mark 14 is formed in the principal surface 10a. The principal surface 10a is scanned at the first energy density such that a groove is formed in the surface 10a of the silicon carbide single crystal substrate 10. FIG. 3(a) is a plan view schematically illustrating scanning with a laser beam. A pulsed laser beam is emitted from the laser light source to irradiate the principal surface 10a with every single pulse of the laser beam which is represented by a beam spot 22 with the beam diameter R1 as shown in FIG. 3(a). To irradiate the principal surface 10a of the silicon carbide single crystal substrate 10 with the laser beam at a high energy density, the principal surface 10a is preferably irradiated with the laser beam such that beam spots 22 each of which is formed by a single pulse successively overlap. As the overlapping area of the beam spots 22 increases, heat can be applied to the principal surface 10a at a higher energy density. In this process, a groove 16 which has a cross section such as shown in FIG. 3(b) is formed in the principal surface 10a of the silicon carbide single crystal substrate 10.

To form an identification mark 14 such that it is readily perceivable by a naked eye, the width of the groove 16 which constitutes the identification mark 14 is preferably not less than 50 μm, and the depth of the groove 16 is preferably not less than 20 μm. Usually, the beam diameter of the laser beam is about several micrometers, which is smaller than the preferred groove width. Therefore, it is preferred to form a groove which has a wider groove than the beam diameter of the laser beam by moving the laser beam for scanning in the extending direction of the groove 16 while the laser beam is also moved for scanning in a direction which is not parallel to the extending direction of the groove 16. Specifically, it is preferred to perform scanning according to a scanning pattern 24 which is zigzagged with respect to the extending direction of the groove 16. When scanning is performed with the laser beam with the kerf width W2, the groove 16 with the width W1 is formed.

By the laser beam irradiation, the silicon carbide monocrystal is melted to a predetermined depth from the principal surface 10a of the silicon carbide single crystal substrate 10, and the melted silicon carbide monocrystal partially evaporates. Part of the melted silicon carbide which has not been evaporated then solidifies. As a result, the groove 16 which constitutes the identification mark 14 is formed in the principal surface 10a of the silicon carbide single crystal substrate 10.

As shown in FIG. 3(b), the internal surface 16a of the groove 16 formed in the principal surface of the silicon carbide single crystal substrate 10 is formed by solidification of the melted silicon carbide monocrystal. Also, minute solidified substances 18 of the solidified silicon carbide are attached onto the internal surface 16a. On the principal surface 10a extending outside the groove 16, there are also solidified substances or a bump 19 formed by solidification.

The solidified substances 18 produced inside the groove 16 and the solidified substances or bump 19 produced outside the groove 16 separate from the silicon carbide single crystal substrate 10 and attach to the principal surface 10a and the principal surface 10b of the silicon carbide single crystal substrate 10 as contaminants so that they can cause adverse effects, become the cause of scratches in the principal surface 10a or the principal surface 10b, or turn to dust to become the cause of contamination of other substrates or contamination inside the semiconductor device, in a subsequent step for fabrication of the silicon carbide single crystal substrate 10 or a manufacture step for manufacturing a semiconductor device using the completed silicon carbide single crystal substrate 10. For example, when an abrasive agent which is for use in the subsequent step that is for fabrication of the silicon carbide single crystal substrate 10 is brought into the groove 16, the abrasive agent is trapped by the internal surface 16a because the surface roughness of the internal surface 16a of the groove 16 is large, so that there is a probability that the abrasive agent cannot be removed from the groove 16 even by washing.

In the method for forming an identification mark on the silicon carbide single crystal substrate 10 according to the present embodiment, the finishing laser process (step S13) is performed, after the rough laser process, on the groove 16 which has been formed by the rough laser process in order to solve the above problems. By the finishing laser process, the solidified substances 18 and the bump 19 that have previously been described are again melted and evaporated such that the solidified substances 18 and the bump 19 are removed. Further, the internal surface 16a is melted and solidified so as to have a smooth internal surface. The solidified substances 18, the bump 19, and the internal surface 16a are formed by solidification of melted silicon carbide monocrystal, so that they are amorphous or have low crystallinity. Further, in the rough laser process, carbon or silicon selectively evaporates, so that solidified substances 18, the bump 19, and the internal surface 16a have a composition in which silicon or carbon is excessively contained or a composition in which silicon or carbon is bound to oxygen. These can be melted and evaporated even when the applied energy is not as large as the first energy density in the rough laser process.

For example, where the processing energy is estimated by a product of the melting point and the thermal conductivity and the processing energy of silicon carbide is 1, the processing energy of Si is about 0.2 and the processing energy of $SiO_2$ is about 0.02. Thus, by scanning the inside of the groove 16 which has been formed in the surface 10a of the silicon carbide single crystal substrate 10 at the second energy density that is lower than the first energy density, the solidified substances 18 and the bump 19 can be removed, and also, the internal surface 16a can be smoothed. Further, since the laser beam irradiation is performed at an energy density which is lower than the first energy density, a portion extending outside the groove 16 which is made of silicon carbide monocrystal would not be newly melted or evaporated. That is, the laser beam irradiation is preferably performed at the second energy density such that the silicon carbide monocrystal is not melted or evaporated. Thus, production of new solidified substances 18 or bump 19 by the finishing laser process is prevented. It is preferred that the ratio of the total energy of the finishing laser process to the total energy of the rough laser process is about not less than 10% and not more than 40%.

A pulsed laser beam is emitted from the laser light source to irradiate the inside of the groove 16 formed in the principal surface 10a with every single pulse of the laser beam which is represented by a beam spot 22' with the beam diameter R1 as shown in FIG. 4(a). In FIG. 4(a), the positions of the beam spot 22 in the rough laser process are shown by broken lines. As seen from FIG. 4(a), the overlapping area of the beam spots 22' is smaller than that of the beam spots 22 so that the second energy density is smaller than the first energy density. The other methods for decreasing the second energy density include decreasing the laser power and increasing the scanning speed.

Preferably as shown in FIG. 4(a), the scanning direction of the laser beam in the step of the rough laser process and the scanning direction of the laser beam in the finishing laser process are different from each other. With this arrangement, the unevenness in the internal surface 16a of the groove 16 which depends on the scanning direction of the laser beam in the step of the rough laser process is flattened in the finishing laser process, so that the inside of the groove 16 can be further smoothed. In the present embodiment, the inside of the groove 16 is scanned with the laser beam according to a scanning pattern 24' which is parallel to the extending direction of the groove 16. As shown in FIG. 4(a), it is preferred that a portion extending outside the groove 16 is also irradiated with the beam spots 22' in order to remove the bump 19 which has been produced outside the groove 16 of the principal surface 10a. With this arrangement, the wall surface of the groove 16 is also irradiated with the laser beam at a sufficient energy density, whereby the solidified substances 18 attached to the plane surface are removed, and the wall surface is smoothed. In other words, it is preferred that a region which is irradiated with the laser beam by the finishing laser process entirely includes a region which is irradiated with the laser beam in the step of the rough laser process and is also wider than a region which is irradiated with the laser beam in the rough laser process. Where a region which is irradiated with the laser beam in the finishing laser process and a region which is irradiated with the laser beam in the rough laser process are respectively referred to as the first region and the second region, the area of the second region is preferably 100% or more of the area of the first region. To remove the bump 19 which is produced outside the groove 16, the area of the second region is preferably 110% or more of the area of the first region.

As shown in FIG. 4(b), by the finishing laser process, the solidified substances 18 which have been formed inside the groove 16 are removed, and the internal surface 16b of the groove 16 is further smoothed. The bump 19 which has been produced outside the groove 16 of the principal surface 10a is also removed. As a result of the finishing laser process, the surface roughness Ra is not more than 1 μm at least at the bottom surface of the internal surface 16b of the groove 16.

The finishing laser process may be performed after the entirety of the identification mark 14 is formed by the rough laser process and the rough laser process is completed, or may be performed on parts of the identification mark 14 which have undergone the rough laser process one after another. In this case, the rough laser process and the finishing laser process are concurrently performed, and it is therefore preferred to provide a laser light source for the rough laser process and another laser light source for the finishing laser process. Where the pulse interval of the laser beam in the rough laser process is t and the interval between the rough laser process and the finishing laser process which are performed in an identical region of the identification mark 14 is T, T is sufficiently longer than t. That is, T>>t, so that part of the silicon carbide monocrystal which is melted by the rough laser process is solidified and sufficiently cooled before the finishing laser process.

Formation of the identification mark 14 in the silicon carbide single crystal substrate 10 may be completed through the above-described processes. Alternatively, finishing of the identification mark 14 or finishing of the principal surface 10a in which the identification mark 14 is provided may be performed. When mechanical polishing is performed on the principal surface 10a of the silicon carbide single crystal substrate 10 in which the identification mark 14 has been formed such that the surface roughness of the principal surface 10a is reduced, when there is a minute bump 19' remaining outside the groove 16 of the principal surface 10a and the bump 19' is to be removed, or when the surface roughness of the internal surface 16b of the groove 16 is further reduced, mechanical polishing is performed on the principal surface 10a of the silicon carbide single crystal substrate 10 (step S14). Specifically, the principal surface 10a of the silicon carbide single crystal substrate 10 is mechanically polished using a metal surface plate and an abrasive agent. In this process, the abrasive agent enters the inside of the groove 16 so that the internal surface 16b of the groove 16 is also polished with the abrasive agent. As a result, as shown in FIGS. 5(a) and 5(b), the silicon carbide single crystal substrate 10 is obtained in which the surface roughness of the internal surface 16b' is small and which has a principal surface 10a' with a reduced surface roughness. Further, the bump 19' remaining outside the groove 16 also can be removed by this process.

To remove a damage layer which is formed over the surface of the principal surface 10a of the silicon carbide single crystal substrate 10 due to the laser beam irradiation or solidification of melted silicon carbide, gas phase etching of the principal surface 10a may be performed (step S15). Examples of the etching by the gas phase method which can be employed in the present embodiment include ion etching, sputter etching, reactive ion etching, plasma etching, reactive ion beam etching, and ion beam etching. Any other gas phase etching method may be employed.

The type of the gas used in the gas phase etching is not particularly limited. However, it is preferred to use a gas which contains fluorine, such as carbon tetrafluoride or sulfur hexafluoride or a gas which has reactivity with silicon carbide, such as hydrogen. Further, oxygen may be added in order to enhance oxidation. The conditions for the etching, such as the power to apply, depend on the apparatus used for the etching, for example. The etching rate preferably does not exceed 10 μm/h. If the etching rate exceeds 10 μm/h, the etching conditions would be excessively intense for the principal surface 10a of the silicon carbide single crystal substrate 10 so that, probably, the principal surface 10a is damaged by ion collision or the surface morphology of the principal surface 10a after the etching deteriorates. Thus, this excessive etching rate is not preferred.

Since the thickness of the damage layer is small, the etching that is based on the gas phase method does not need to be performed for a long period of time. In the gas phase etching, the etching progresses generally uniformly so that the surface roughness of the principal surface 10a scarcely varies. Thus, a principal surface can be obtained in which the surface roughness of the principal surface 10a before the gas phase etching is generally maintained and from which the damage layer has been removed.

If the principal surface 10b of the silicon carbide single crystal substrate 10 is a surface which is finished by mechanical polishing in formation of the above-described identification mark, mechanical polishing and mirror polishing may be performed on the principal surface 10b after the formation of the identification mark.

By the method for forming an identification mark on a silicon carbide single crystal substrate according to the present embodiment, a silicon carbide single crystal substrate 10 with an identification mark 14 is obtained that is constituted of a groove 16 which has such a depth and a width that excellent visibility is achieved. Solidified substances 18 and the like are scarcely remaining in the groove 16 which constitutes the identification mark 14, and at least the bottom surface of the internal surface 16a has a surface roughness of not more than 1 μm. Therefore, even when mechanical polishing, CMP (chemical mechanical polishing), or the like, is further performed on the principal surface 10a in a subsequent step, the solidified substances 18 are prevented from separating from the groove and causing scratches in polishing of the principal surface 10a. Also, since the internal surface 16b of the groove 16 is smooth, the abrasive agent would not enter or reside in the groove 16. Thus, an excellent silicon carbide single crystal substrate 10 is obtained in which occurrence of various problems which are attributed to formation of the identification mark 14 is prevented in the process of fabricating the silicon carbide single crystal substrate 10 or in the process of manufacturing a semiconductor device.

EXAMPLES

Hereinafter, an example of formation of an identification mark on a silicon carbide single crystal substrate with the use of a method for forming an identification mark on a silicon carbide single crystal substrate according to the present embodiment is described.

A 4H silicon carbide single crystal substrate with a diameter of 3 inches was provided. The surface roughness Ra of the principal surface in which an identification mark was to be formed was 0.3 μm. The laser light source used was a Nd:YAG laser (wavelength: 1064 nm, power: 1.5 W) manufactured by ESI, Inc. This laser light source had a Q-switch and was used to perform the rough laser process and the finishing laser process under the conditions of Examples 1, 2, and 3 as shown in Table 1 such that an identification mark of nine characters was formed. In Comparative Example, only the rough laser process was performed for formation of an identification mark. In Table 1, the kerf width refers to W2 of FIG. 3. When the kerf width was 0, the principal surface of the substrate was scanned with a laser beam along a groove to be formed. For example, when the width of the groove was about three times the diameter of the laser beam, the principal surface was scanned with the laser beam such that spots in the left column shown in FIG. 3 were drawn, the principal surface was then scanned with the laser beam such that spots in the center column were drawn, and lastly, the principal surface was scanned with the laser beam such that spots in the right column were drawn. In Table 1, the energy density is a relative value which was determined with respect to the energy density of Comparative Example which was assumed as 100. The total energy refers to a total energy which was supplied to the substrate by laser beam irradiation for marking a straight line of 1 mm in each of the rough laser process and the finishing laser process. The energy ratio refers to the ratio of the total energy of the finishing laser process to the total energy of the rough laser process.

After the formation of the identification mark by the laser, the principal surface in which the identification mark was formed was subjected to mechanical polishing with the use of a diamond slurry in which diamond particles with the average particle diameter of 5 μm were contained as the abrasive agent.

After the mechanical polishing, the inside of the groove constituting the identification mark was observed with an optical microscope to check whether there was an attached substance, such as a solidified substance, on the bottom surface and the lateral surfaces of the groove. Further, the depth and the width of the groove were measured using an optical length-measuring microscope. The measurement was performed at an arbitrary position in the groove, where the groove width on the substrate surface and the groove depth from the substrate surface were measured. The measurement was carried out at one arbitrary position in each of the grooves of three out of nine characters. Further, the surface roughness Ra of the bottom surface of the groove was measured using the optical interference type surface roughness measuring apparatus HD-2000 manufactured by Veeco Instruments Inc. The measurement was performed on a central portion at an arbitrary position in the groove, along the line direction (the longitudinal direction of the groove), in the length of about 0.2 mm. The measurement was carried out along one arbitrary line in each of the grooves of three out of nine characters. The results are shown in Table 2.

TABLE 1

| | | Example 1 | Example 2 | Example 3 | Comparative Example |
|---|---|---|---|---|---|
| Rough Laser Process | Q rate (Hz) | 7000 | 500 | 500 | 3000 |
| | Power (%) | 100 | 100 | 100 | 100 |
| | Speed (mm/s) | 40 | 10 | 15 | 8 |
| | Kerf Width (mm) | 0 | 0.08 | 0.08 | 0.15 |
| | Energy Density | 70 | 75 | 72 | 100 |
| | Number of Scanning Cycles | 3 | 1 | 1 | 1 |
| | Total Energy (W) | 788 | 1200 | 1200 | 4200 |
| Finish Laser Process | Q rate (Hz) | 500 | 500 | 500 | None |
| | Power (%) | 100 | 100 | 100 | |
| | Speed (mm/s) | 10 | 10 | 10 | |
| | Kerf Width (mm) | 0 | 0 | 0 | |

TABLE 1-continued

| | Example 1 | Example 2 | Example 3 | Comparative Example |
|---|---|---|---|---|
| Energy Density | 10 | 10 | 10 | |
| Number of Scanning Cycles | 3 | 3 | 5 (with offset) | |
| Total Energy (W) | 225 | 225 | 375 | |
| Energy Ratio (%) | 29 | 19 | 31 | |

TABLE 2

| Evaluated Items | | Example 1 | Example 2 | Example 3 | Comparative Example |
|---|---|---|---|---|---|
| Attached Substance Inside Groove | Groove Bottom | No | No | No | Yes |
| | Wall Surface | No | Yes | No | Yes |
| Groove Depth (μm) | Before Polish | 45 | 50 | 50 | 60 |
| Groove Width (μm) | Before Polish | 45 | 100 | 110 | 150-170 |
| | After Polish | 30 | 80 | 80 | 170 |
| Surface Roughness of Groove Bottom Surface Ra (μm) | | 0.4-0.6 | 0.4-0.6 | 0.4-0.6 | 5.0-7.0 |

As seen from Table 2, no attached substance was found at the bottom surface of the groove in either of Examples 1, 2, and 3. In Examples 1 and 3, no attached substance was also found at the wall surface of the groove. On the other hand, in Comparative Example, attached substances were found at the bottom surface and the wall surface of the groove. This is probably because, in the methods of Examples 1, 2, and 3, solidified substances in the groove were removed by the finishing laser process. It was found from the results of Examples 1, 2, and 3 that attached substances can be entirely removed so long as the energy of the finishing laser process is approximately not less than 19% and not more than 31% of that of the rough laser process. It is understood that, when a margin of about 10% is considered, the energy ratio only needs to be approximately not less than 10% and not more than 40%.

In Example 2, the reason why there was an attached substance on the wall surface is probably that the laser beam of the finishing laser process failed to irradiate the wall surface inside the groove with a sufficient intensity. On the other hand, in Example 3, the finishing laser process was performed through five cycles, and in each scanning cycle, the position of the beam was offset by 0.02 mm. Therefore, it is inferred that the beam of the finishing laser process successfully uniformly irradiated the entire surface inside the groove.

In each of Examples 1, 2, and 3, the surface roughness Ra of the bottom surface of the groove of the formed identification mark was in the range of 0.4 μm to 0.6 μm. On the other hand, in Comparative Example, the surface roughness Ra of the bottom surface of the groove was in the range of 5.0 μm to 7.0 μm. It was found from this result that the surface roughness of the internal surface of the groove of the identification mark which was formed according to the methods of Examples 1, 2, and 3 was improved to about 1/10 of the surface roughness of the groove which was formed according to the conventional method. In Examples 1, 2, and 3 and Comparative Example, reduction of the surface roughness Ra by the mechanical polishing is estimated at about 50 nm to 100 nm, and therefore, the above-described difference in surface roughness Ra is not attributed to the mechanical polishing which is performed after the formation of the identification mark. In Examples 1, 2, and 3, it can be said that the surface roughness Ra of the bottom surface of the internal surface of the groove of the identification mark before the mechanical polishing is at least not more than 1 μm.

It was confirmed that the identification marks of Examples 1, 2, and 3 had improved visibility for a naked eye as compared with Comparative Example. It was also confirmed that the identification marks which were formed by the methods of Examples 2 and 3 had further improved visibility for a naked eye as compared with the identification mark which was formed by the method of Example 1.

Figure 6:
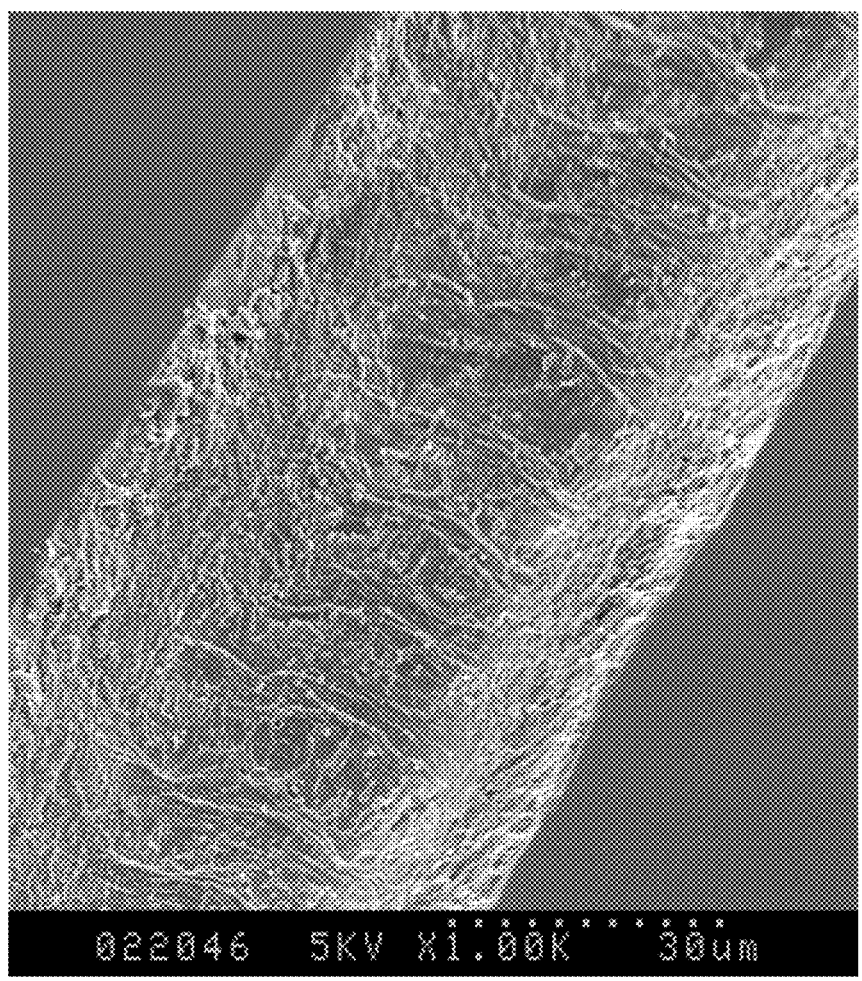
FIG. 6 is a SEM image of a groove of an identification mark formed by the method of Example 3.

FIG. 6 is an enlarged SEM image showing a portion of a groove of an identification mark which was formed by the method of Example 3. As seen from FIG. 6, there was substantially no contaminant on the bottom surface and the lateral surfaces of the groove. Also, there was substantially no unevenness in the internal surface of the groove, and it is appreciated that the surface roughness of the internal surface was very small. Particularly, it can be seen that the bottom surface of the groove was a solidified surface, and it had a striped pattern which was generally perpendicular to the extending direction of the groove. This is probably because a solidified substance was removed by the finishing laser process, and as a result, traces were formed at the bottom surface of the groove due to sequential melting and solidification of silicon carbide monocrystal along the traveling direction of the beam spot in the rough laser process, i.e., the scanning direction of the laser beam. Formation of a solidified surface over the internal surface of the groove prevented minute contaminants from remaining on the surface.

It is also seen that edges which defined the groove were also sharp, and the principal surface extending outside the groove was flat. It was confirmed that an identification mark having a desired shape was also formed by the method of Example 1. In view of these circumstances, we consider that the identification mark formation methods of Examples 1 and 3 are more preferred among Examples 1, 2, and 3.

Figure 7:
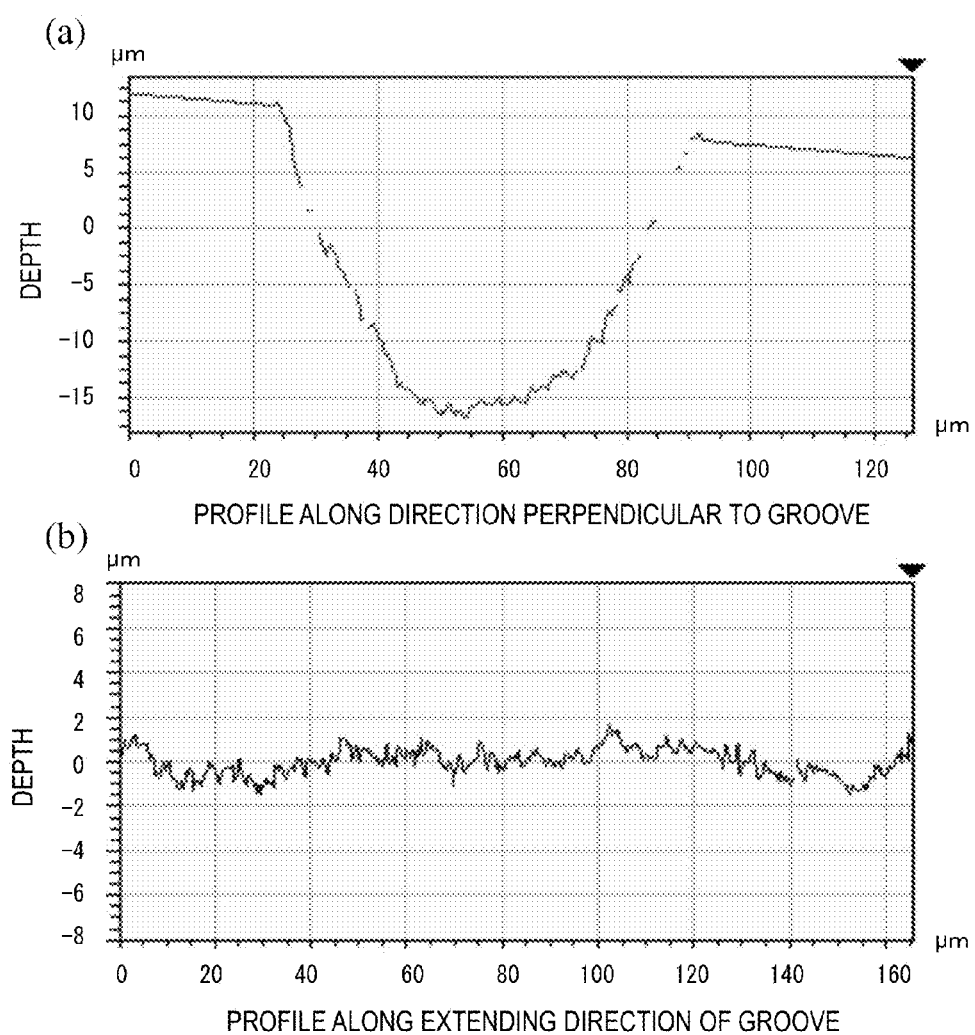
FIGS. 7(a) and 7(b) are a surface profile along the cross-sectional direction and a surface profile along the longitudinal direction of a groove which constitutes an identification mark which is formed by the method of Example 3.

FIGS. 7(a) and 7(b) respectively show a surface profile along a direction perpendicular to the extending direction of a groove of an identification mark formed by the method of Example 3 and a surface profile along the extending direction of that groove. As seen from these graphs, of the internal surface of the groove, at least the bottom surface had a surface roughness Ra of not more than 1 μm.

Figure 8:
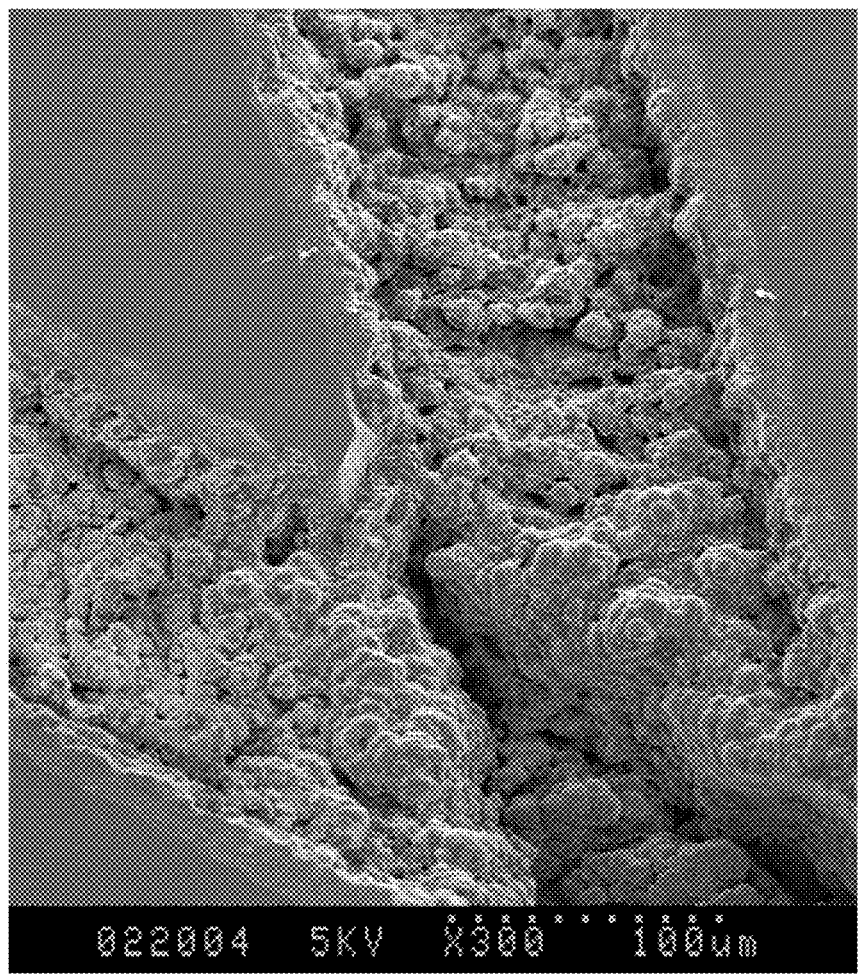
FIG. 8 is a SEM image of a groove of an identification mark formed by the method of Comparative Example.

FIG. 8 is an enlarged SEM image showing a portion of a groove of an identification mark which was formed by the method of Comparative Example. As seen from FIG. 8, there were a large number of small solidified substances attached onto the internal surface of the groove so that the internal surface of the groove had an uneven shape. Also, the principal surface extending outside the groove was not flat but had bumps. FIGS. 9(a) and 9(b) respectively show a surface profile along a direction perpendicular to the extending direction of a groove of an identification mark formed by the method of Comparative Example and a surface profile along the extending direction of that groove. As seen from these graphs, the internal surface of the groove had a surface roughness Ra of not less than several tens of micrometers, so that the internal surface of the groove was not smooth.

From the above results, it was found that an identification mark constituted of a groove which has no contaminant attached onto the internal surface and of which the internal surface is very smooth can be formed by the methods of Examples in which the rough laser process and the finishing laser process are performed. Employing a mark which is in the form of a groove rather than dots contributes to excellent identifiability. It was found that, from the viewpoint of visibility, a kerf width is provided, and the scanning pattern of the laser beam is zigzagged in such a manner that a groove width of not less than about 50 μm is secured, whereby an identification mark with excellent visibility can be formed.

INDUSTRIAL APPLICABILITY

The present invention is suitably applicable to a silicon carbide single crystal substrate which is used in various uses, including manufacture of a semiconductor device.

REFERENCE SIGNS LIST

10 silicon carbide single crystal substrate
10a, 10b principal surface
12 orientation flat
14 identification mark
16 groove
18 solidified substance
19 bump
22 beam spot
24 scanning pattern

The invention claimed is:

1. A method for forming an identification mark on a silicon carbide single crystal substrate, comprising:
   (a) scanning a principal surface of a silicon carbide single crystal substrate with a laser beam at a first energy density such that a groove is formed in the principal surface of the silicon carbide single crystal substrate, thereby forming an identification mark which is constituted of one or more grooves in the principal surface of the silicon carbide single crystal substrate; and
   (b) scanning an inside of the groove formed in the principal surface of the silicon carbide single crystal substrate with a laser beam at a second energy density that is lower than the first energy density.

2. The method of claim 1, wherein a width of the groove is not less than 50 μm, and a depth of the groove is not less than 20 μm.

3. The method of claim 1 wherein, at least at a bottom surface of an internal surface of the groove, the surface roughness Ra is not more than 1 μm.

4. The method of claim 1, further comprising
   (c) after step (b), performing mechanical polishing on the principal surface of the silicon carbide single crystal substrate.

5. The method of claim 4 wherein, after step (c), gas phase etching is performed on the principal surface of the silicon carbide single crystal substrate.

6. The method of claim 1, wherein the surface roughness Ra of the principal surface of the silicon carbide single crystal substrate is not less than 0.1 nm and not more than 2.0 nm.

* * * * *